(12) United States Patent
Mauersberger (10) Patent No.: US 7,100,130 B2
(45) Date of Patent: Aug. 29, 2006

(54) DEVICE FOR THE EMULATION OF DESIGNS FOR INTEGRATED CIRCUITS

(75) Inventor: Heiko Mauersberger, Erfurt (DE)

(73) Assignee: PRO DESIGN Electronic & CAD Layout GmbH, Bruckmuhl (DE)

( * ) Notice: Subject to any disclaimer, the term of this patent is extended or adjusted under 35 U.S.C. 154(b) by 82 days.

(21) Appl. No.: 10/649,230

(22) Filed: Aug. 26, 2003

(65) Prior Publication Data

US 2005/0028127 A1 Feb. 3, 2005

(30) Foreign Application Priority Data

Jul. 30, 2003 (EP) .................................. 03016640

(51) Int. Cl.
*G06F 17/50* (2006.01)
*H01L 25/00* (2006.01)

(52) U.S. Cl. .............................. 716/4; 716/16; 716/17; 326/41

(58) Field of Classification Search ................ 716/4–5, 716/16–18; 326/38–39, 41; 703/28
See application file for complete search history.

(56) References Cited

U.S. PATENT DOCUMENTS 5,742,181 A * 4/1998 Rush ............................ 326/41

6,263,484 B1 7/2001 Yang

OTHER PUBLICATIONS

Hauck, IEEE Proceedings "The Roles of FPGA's in Reprogrammable Systems", Apr. 1, 1998, vol. 86, No. 4.
Carrera, J M et al., "Architecture of a FPGA-based Coprocessor": the PAR-1 1995 IEEE.
Khalid, Mohammed A. S., "Routing Architecture and Layout Synthesis For Multi-FPGA Systems", 1999, University of Toronto, Canada.

* cited by examiner

*Primary Examiner*—Paul Dinh
(74) *Attorney, Agent, or Firm*—Townsend and Townsend and Crew LLP (57) ABSTRACT

A device for the emulation of designs for integrated circuits having a receiving device for multiple programmable logic circuits, particularly FPGAs, and an electrical connection structure. The interconnection structure has bus lines, each of which includes multiple channels. The interconnection structure is configured so that each programmable logic circuit is connected to at least one bus line and the connection structure is implemented so it can be flexibly interconnected, wherein the assignment of at least a part of the terminal contacts of any programmable logic circuit is freely programmable and wherein at least a part of the bus lines connected to the programmable logic circuits are alternately electrically connectable to one another in such a way that at least one channel of a bus line is electrically connectable to a channel of at least one other bus line using a switch.

10 Claims, 6 Drawing Sheets

DEVICE FOR THE EMULATION OF DESIGNS FOR INTEGRATED CIRCUITS

BACKGROUND OF THE INVENTION

The present invention relates to a device for emulating designs for integrated circuits.

A common method of verifying designs for integrated circuits, or chip designs, is imaging them using programmable hardware. Such programmable hardware is frequently constructed from programmable logic circuits, or FPGA circuits (FPGA: field programmable gate array). The procedure of verification on such hardware is referred to as "emulation" or "rapid prototyping".

Since, due to the size and complexity of a design, it is not always possible to image the entire design in only one single programmable logic circuit, programmable hardware is used which is made of multiple programmable logic circuits. A problem arising in this case is the suitable interconnection of the logic circuits with one another. If only two logic circuits are connected to one another, this connection may be constructed easily as a one-to-one interconnection. However, if three logic circuits are to be connected to one another, they may be connected either in a star structure, in a triangular structure, or in a mixed form. Multiple line intersections arise even in this case, which must be housed optimally on the circuit board which accommodates the logic circuits. The more programmable logic circuits which must be used in order to verify a chip design, the more complicated the structures become. If these structures are now imaged on a circuit board produced especially for the application, essentially two disadvantages result:

- the structure must already be fixed during circuit design and layout of the circuit board. Since, however, the chip design to be verified is usually still in development at this point in time, it is extremely difficult to produce a layout of the circuit board beforehand. Furthermore, problems arise if, due to changes in the development, the necessary structure changes, so that the circuit board must then be modified;
- a circuit board manufactured for a special application may typically not be used for future applications, since there are then still other requirements for the connection structure.

A method of using an electronic reconfigurable gate field logic and a device produced by it, in which the logic circuits are connected to one another via a crossbar circuit arrangement (arrangement of crossbar chips), is known from European Patent 0 651 343.

However, this achievement of the object using crossbar circuits is not very advantageous, since crossbar circuits are special circuits which have a limited field of use and whose availability on the market is not always guaranteed. In addition, the corresponding housing of the crossbar circuit chips and its construction become more complex the greater the number of lines to be connected is. Correspondingly, the circuit board design for chips of this type is also extremely complex. Due to the high complexity of these crossbar circuit chips, in which every signal may be connected to every signal, only relatively long transfer times of the signals are achieved. In the present application, this has a direct influence on the verification speed and the verification time, in that the verification speed sinks and the verification time rises. However, the goal in the emulation of designs for integrated circuits is to verify the chip design using the highest possible speed and therefore to minimize the verification time.

SUMMARY OF THE INVENTION

It is therefore an object of the present invention to implement a device for the emulation of designs for integrated circuits in such a way that, with higher flexibility of the connection structure, a high verification speed is made possible and therefore the verification time may be minimized.

This object is achieved by the features specified herein.

For the embodiment of the emulation device according to the present invention, an intrinsic property of the programmable logic circuits, particularly the FPGAs, is used, specifically that the signals from the logic circuit may be routed to arbitrary terminal contacts of the logic circuit. In contrast, in typical integrated circuits (such as processors), the terminal contacts are permanently assigned to internal structures of the circuit. In the object of the present invention, the flexible property of the arbitrary contacting of the terminal contacts with internal structures of the logic circuit is exploited, in combination with the bus lines which may be alternately connected to one another, in order to produce precisely those combination possibilities which are necessary for the construction of the design of the integrated circuit. Therefore, all combination possibilities which are possible in principle do not have to be provided, as is the case in the related art operating using crossbar circuits.

Preferably, multiple channels of a bus line may be electrically connected alternately to multiple channels of another bus line, each channel of one bus line being electrically connectable to the assigned channel of the other bus line, and the individual channels being connectable independently of one another. The flexibility is elevated through this embodiment.

Connection bus lines for direct connection of the corresponding logic circuits to one another are preferably provided between at least a part of the programmable logic circuits. If one assumes a typical chip design, which is distributed on multiple logic circuits (such as FPGAs), the probability is high that neighboring logic circuits require more connection lines between one another than logic circuits which are farther away from one another. Connection bus lines for direct connection are provided for these connection lines of the neighboring logic circuits. In this way, the number of switches necessary is reduced and the signal transfer times are noticeably reduced due to the short direct connection paths.

In a preferred refinement, multiple receiving devices are connectable to one another via connection devices, the connection devices having switchable bus lines. In this way, it is possible to provide a modularly constructed device which is implemented by connecting multiple receiving devices which may be constructed essentially identically.

In this case, main connection devices are preferably provided, each of which connects two receiving devices to one another, the main connection devices having bus lines which connect the particular bus lines of the two receiving devices assigned to one another with one another and the bus lines of a main connection device being alternately electrically connectable to one another in such a way that at least one channel of a bus line is electrically connectable to a channel of at least one other bus line. Using main connection devices of this type, two receiving devices at a time may be connected to one another into a receiving device pair in a simple way.

Furthermore, it is advantageous if group connection devices are provided, which each connect two receiving device pairs, including two receiving devices connected using a main connection device, and a group connection device having bus lines which are connected to the bus lines of the particular receiving device pair and the bus lines of the group connection devices each being switchable in such a way that each channel of each bus line of the group connection device is assigned to a switch and the particular switches may be switched on and off independently of one another. Providing these group connection devices allows pairs of receiving devices, which are each connected to one another using a main connection device, to be connected in series nearly arbitrarily.

In a preferred implementation of the device according to the present invention, the receiving devices, the main connection devices, and the group connection devices have circuit boards which are provided on their upper side and their lower side with plug connector arrangements made of multiple plug connectors which are situated in the same position on the particular circuit board, and the bus lines of the particular circuit board leading outward are electrically connected in the same way with the upper plug connectors and with corresponding lower plug connectors of the particular plug connector arrangement. This embodiment allows a modular construction of the device according to the present invention, since receiving devices, main connection devices, and group connection devices may simply be positioned one over another and plugged together for contacting.

A preferred embodiment of this modular construction is distinguished in that the circuit boards are positioned one over another and mechanically and electrically connected to one another using the plug connector arrangements, each two circuit boards of the receiving devices being connected like a sandwich into a receiving device pair using a circuit board of a main connection device positioned between them, and the receiving device pairs being connected to one another using the circuit boards of the group connection devices. Through this sandwich-like and modular arrangement of the receiving devices, main connection devices, and group connection devices, a compact block arises as the construction of a device according to the present invention, having extremely short signal pathways and correspondingly short signal transfer times, through which a high verification speed may be achieved.

Spacing is preferably provided between some of the plug connectors of the particular plug connector arrangements, which allows cool air to flow through the circuit board sandwich between the plug connectors. In this arrangement, the cool air may flow around the circuit boards and dissipate the heat arising there very effectively, according to the cross-flow principle, for example.

To perform the flexible interconnection of the connection structure of a device for emulating designs for integrated circuits according to the present invention, a computer program which executes the following program steps is especially preferably used:

checking whether elements having a placement setting are provided in the design of an integrated circuit to be emulated;

if elements of this type are provided, assigning a slot of the receiving device for the particular element;

assigning a particular slot for a particular element without a placement setting;

checking whether signals are to be exchanged between the elements and/or with external expansion elements via predetermined terminal contacts;

if this is the case, assigning the particular terminal contacts to one another via corresponding channels of the bus lines;

routing the remaining signals to be exchanged;

calculating the internal and external assignment of the terminal contacts of the logic circuits;

producing the internal connections between the integrated circuit design to be emulated and the assigned terminal contacts of each programmable logic circuit, and producing the external connections between the terminal contacts of the programmable logic circuits and the assigned channels of the bus lines.

A computer program of this type accelerates the procedure of circuit resolution and the connection of the individual logic circuits with one another and activates the individual switches directly.

The present invention is described in greater detail in the following on the basis of an example with reference to the drawing.

DESCRIPTION OF THE PREFERRED EMBODIMENTS

Figure 1:
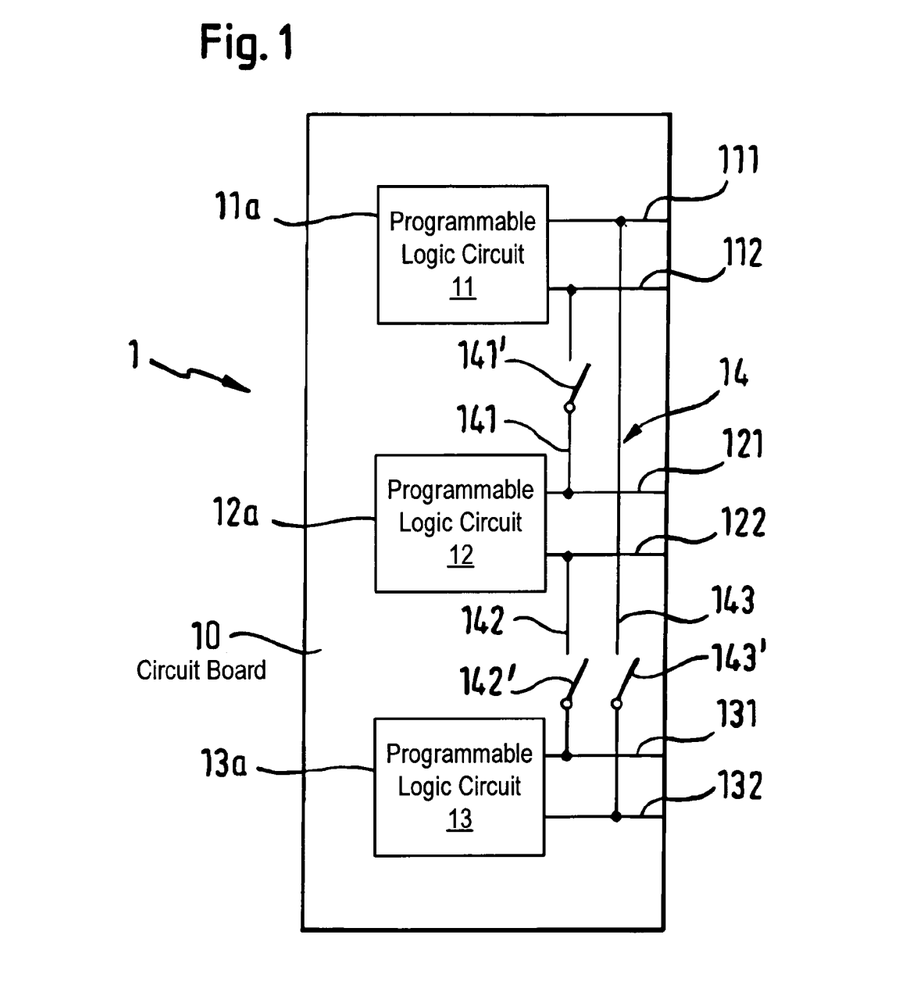
FIG. 1 shows a schematic illustration of a first embodiment of a device according to the present invention.

A receiving device 1 is shown in FIG. 1, which has a circuit board 10, on which three slots 11a, 12a, 13a for programmable logic circuits 11, 12, 13 and an electrical connection structure 14 (only schematically shown in FIG. 1) are provided.

Each of the slots 11a, 12a, 13a for the corresponding programmable logic circuits 11, 12, 13 is connected to two bus lines 111, 112; 121, 122; 131, 132, each of the bus lines being connected to multiple terminal contacts (not shown) of the particular slot 11a, 12a, 13a. Providing two bus lines per slot is only shown as an example; only one bus line or more than two bus lines may be provided per slot.

The bus lines 111, 112; 121, 122; 131, 132 are connected to one another by bus connection lines 141, 142, 143, a further bus switching device 141', 142', 143', described in greater detail below with reference to FIG. 2, being provided in each bus connection line. Specifically, the switchable bus connection line 141 connects the second bus line 112 of the first slot 11a to the first bus line 121 of the second slot 12a. The bus connection line 142 connects the second bus line 122 of the second slot 12a to the first bus line 131 of the third slot 13a. The bus connection line 143 connects the second bus line 132 of the third slot 13a to the first bus line 111 of the first slot 11a.

The bus switching device 141' of the first bus connection line 141 is schematically shown in an enlargement in FIG.

2. It may be seen that the bus switching device 141' is constructed from multiple switches $S_1$ to $S_k$, each of which switches one of the channels 1 to k of the bus connection line 141. The switches $S_1$ to $S_k$ may be switched on and off independently of one another in this case. The bus switch arrangement 141' may be implemented so that it switches all channels of the bus connection line 141 or only part of them. The other bus switching devices 142', 143' are implemented in the same way as the first bus switching device 141'.

Due to the switchability of the individual channels of the bus connection lines 141, 142, 143 and the ability to freely assign the terminal contacts of each programmable logic circuit 11, 12, 13, any desired connection may be produced in a ring structure between the logic circuits 11, 12, 13.

Figure 3:
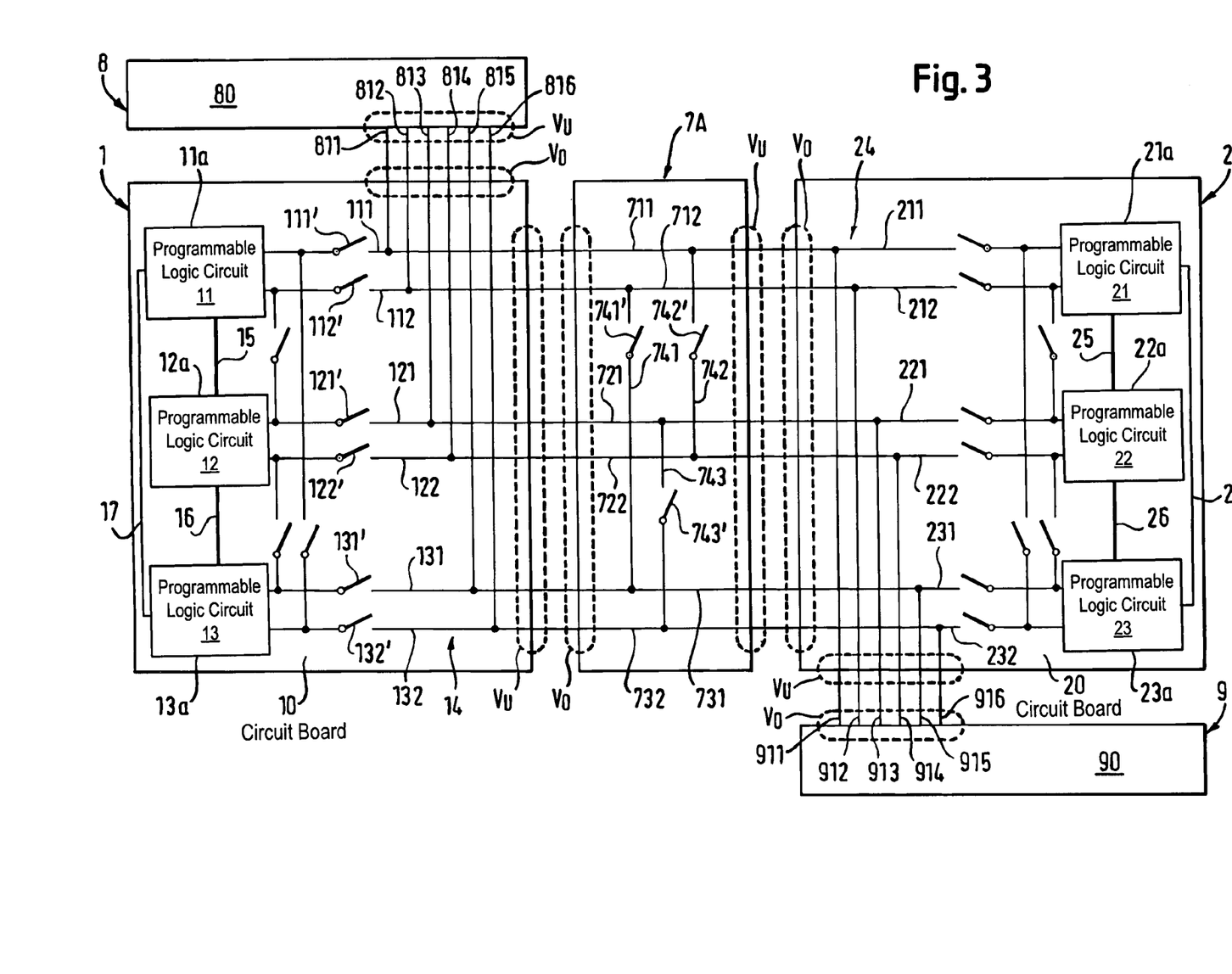
FIG. 3 shows a schematic illustration of a further embodiment of the present invention having two receiving devices which form a receiving device pair.

A pair of two receiving devices 1, 2, which are electrically connected to one another via a main connection device 7A, is shown in FIG. 3. In the figure, the receiving devices 1, 2 and the main connection device 7A are shown in the plane next to one another for better understanding of the electrical connections. In practice, however, they are positioned one over another, as will be described below. The receiving device 1 essentially corresponds to the receiving device 1 from FIG. 1, but contains additional direct connection bus lines 15, 16, 17 on the circuit board 10, the connection bus line 15 connecting a part of the terminal contacts of the first slot 11a to a part of the terminal contacts of the second slot 12a. The second connection bus line 16 connects a part of the terminal contacts of the second slot 12a to a part of the terminal contacts of the third slot 13a and the third connection bus line 17 connects a part of the terminal contacts of the third slot 13a to a part of the terminal contacts of the first slot 11a. Signals are routed via these direct connection bus lines which are exchanged directly between the individual programmable logic circuits 11, 12, 13, without flexible programming of the entire routing being necessary for this purpose.

The circuit board 10 of the first receiving device 1 also has, in contrast to the circuit only shown schematically in FIG. 1, bus switching devices 111', 112'; 121', 122'; 131', 132', each of which is provided in the assigned bus lines 111, 112; 121, 122; 131, 132 on the side of the particular bus connection line 141; 142; 143 facing away from the associated slot 11a; 12a; 13a. These bus switching devices 111', 112'; 121', 122'; 131', 132' are constructed exactly like the bus switching device shown in FIG. 2. The bus lines 111, 112, 121, 122, 131, 132 are, on the side facing away from the switching devices 111', 112'; 121', 122'; 131', 132' in relation to the assigned slot 11a; 12a; 13a, electrically connected to plug connectors (only schematically shown in FIG. 3) of an upper plug connector arrangement $V_O$, and to plug connectors (also only schematically shown in FIG. 3) of a lower plug connector arrangement $V_U$ positioned on the lower side of the circuit board 10. In this case, each channel of a bus line is assigned a contact of the upper plug connector arrangement $V_O$ and the contact of the lower plug connector arrangement $V_U$ corresponding thereto.

In the example of FIG. 3, the receiving device 2 includes a circuit board 20, which is shown mirror-reversed to the circuit board 10 of the receiving device 1 in this schematic circuit view. In the practical embodiment, however, the circuit boards 10 and 20 are constructed essentially identically. The receiving device 2 also has three programmable logic circuits 21, 22, 23 which are connected to one another via a connection structure 24 in the same way as in the receiving device 1. The direct connection bus lines 25, 26, 27 are also provided analogously. The bus lines 211, 212, 221, 222, 231, 232 originating from the slots 21a, 22a, 23a of the circuit board 20 correspond to the bus lines of FIG. 1 having a reference number lower by 100. The corresponding bus connection lines are also provided as in the receiving device 1 and provided with corresponding bus switching devices. The construction of the receiving device 2 therefore corresponds to that of the receiving device 1.

The main connection device 7A positioned between the receiving devices 1 and 2 has corresponding bus lines 711, 712; 721, 722; 731, 732, which connect the particular bus lines of the receiving devices 1 and 2 to one another via particular plug connectors of an upper plug connector arrangement $V_O$ and a lower plug connector arrangement $V_U$. In this case, the first bus line 711 connects the bus line 111 of the receiving device 1 to the bus line 211 of the receiving device 2. The second bus line 712 connects the bus line 112 of the receiving device 1 to the bus line 212 of the receiving device 2. The third bus line 721 connects the bus line 121 of the receiving device 1 to the bus line 221 of the receiving device 2. The fourth bus line 722 connects the bus line 122 of the receiving device 1 to the bus line 222 of the receiving device 2. The fifth bus line 731 connects the bus line 131 of the receiving device 1 to the bus line 231 of the receiving device 2. The sixth bus line 732 connects the bus line 132 of the receiving device 1 to the bus line 232 of the receiving device 2.

The main connection device 7A is also provided with switchable bus connection lines 741, 742, 743, the bus connection line 741 connecting the second bus line 712 to the fifth bus line 731. The bus connection line 742 connects the first bus line 711 to the fourth bus line 722, and the bus connection line 743 connects the third bus line 721 to the sixth bus line 732.

Figure 2:
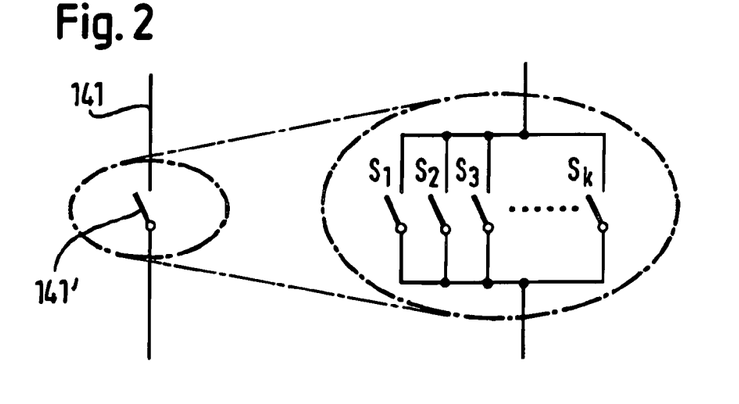
FIG. 2 shows an enlarged schematic illustration of a switchable bus line according to the present invention.

Each of the bus connection lines 741, 742, 743 has a bus switching device 741', 742', 743', which are each constructed corresponding to the bus switching device shown in FIG. 2.

The bus switching devices in the main connection device 7A allow, in connection with the bus switching devices of the receiving devices 1 and 2, any arbitrary interconnection of the terminal contacts, which are applied to the individual bus channels, of the particular slots 11a, 12a, 13a, 21a, 22a, 23a for the programmable logic circuits 11, 12, 13, 21, 22, 23, in a ring structure, or in a star structure, or even in a mixed structure.

If the main connection device 7A is used with only one receiving device 1; 2, in addition to the possibility of the connection of a ring structure shown in FIG. 1, the connection of a star structure or a hybrid structure mixed from these two structures also becomes possible.

Furthermore, FIG. 3 shows an expansion device 8, which is connected via plug connectors of a lower plug connector arrangement $V_U$ to plug connectors of the upper plug connector arrangement $V_O$ of the circuit board 10 of the receiving device 1, so that the bus lines 111, 112, 121, 122, 131, 132 of the first receiving device 1 are connected to corresponding bus lines 811, 812, 813, 814, 815, 816 of the expansion device 8. The expansion device 8 may, for example, have a circuit board 80 on which electronic components such as processors, memory, or other integrated circuits are provided, which work together with the programmable logic circuits of the design of an integrated circuit to be emulated.

The receiving device 2, whose plug connectors of the upper plug connector arrangement $V_O$ are electrically connected to the plug connectors of the lower plug connector arrangement $V_U$ of the circuit board 70 of the main connection device 7A, is electrically connected, using the plug connectors of its lower plug connector arrangement $V_U$, to a schematically shown neighboring circuit board 90, which may be associated with a further expansion device 9 or may also be associated with a group connection device described in the following. The bus lines 911, 912, 913, 914, 915, 916 of the circuit board 90 are electrically connected in this case in a corresponding way to the bus lines 211, 212, 221, 222, 231, 232 of the second receiving device 2.

Figure 4:
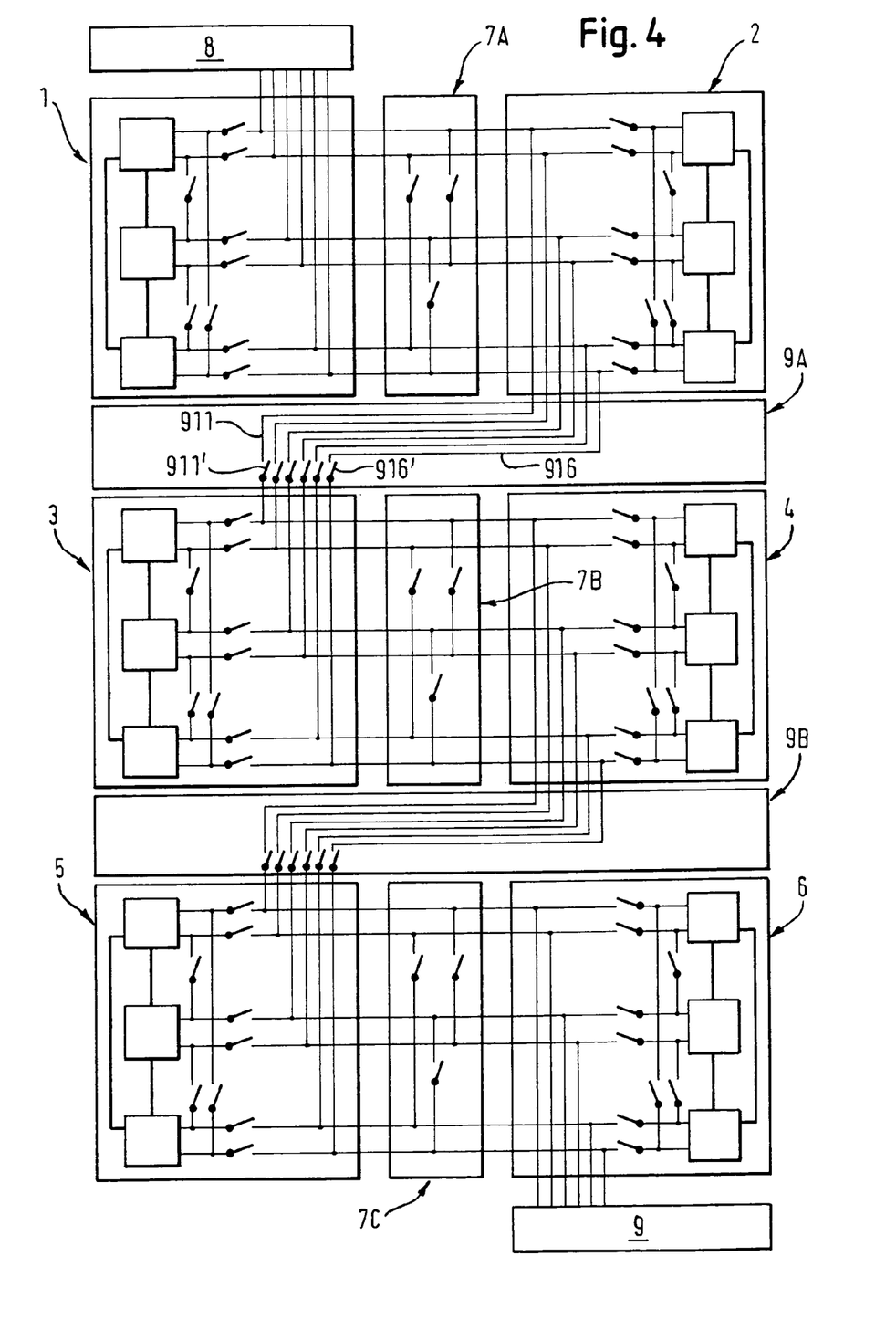
FIG. 4 shows a schematic illustration of a still further embodiment of the present invention having three receiving device pairs.

In FIG. 4, three receiving device pairs 1, 2; 3, 4; 5, 6 are each connected together using group connection devices 9A, 9B into a block of six receiving devices for a total of 18 programmable logic circuits. The receiving device pairs 3, 4 and 5, 6 are constructed in the same way as the receiving device pairs 1, 2 described with reference to FIG. 3 and each include two receiving devices 3, 4 and 5, 6, which are each connected to one another via main connection devices 7B and 7C, respectively. In FIG. 4, the receiving device pairs and the group connection devices 9A, 9B are positioned in the plane one below the other for better understanding of the electrical connection. In practice, however, they are positioned flat one over the other, as will be described below.

The group connection devices 9A and 9B are constructed identically and are connected like the expansion circuit board 9 in FIG. 3 to the neighboring receiving device 2, 4 and/or 4, 6, as was described with reference to the receiving device 2 in connection with FIG. 3 and is shown in FIG. 4 with reference to the receiving devices 4 and 6. Each of the group connection devices 9A, 9B therefore has bus lines 911, 912, 913, 914, 915, and 916, which are electrically connected to the corresponding bus lines of the neighboring receiving devices 2, 4 and/or 4, 6 in the way already described using corresponding plug connectors of upper and lower plug connector arrangements. A bus switching device 911' to 916', which corresponds to the switching device described in connection with FIG. 2, is provided in each of the bus lines 911, 912, 913, 914, 915, 916.

The coupling of the receiving devices 1, 2, 3, 4, 5, 6 using the main connection devices 7A, 7B, 7C and the group connection devices 9A and 9B shown in FIG. 4 allows, in combination with the flexible assignment of the terminal contacts of any programmable logic circuit, any arbitrary interconnection of the individual logic circuits to be performed through suitable selection of the particular switch settings.

Figure 5:
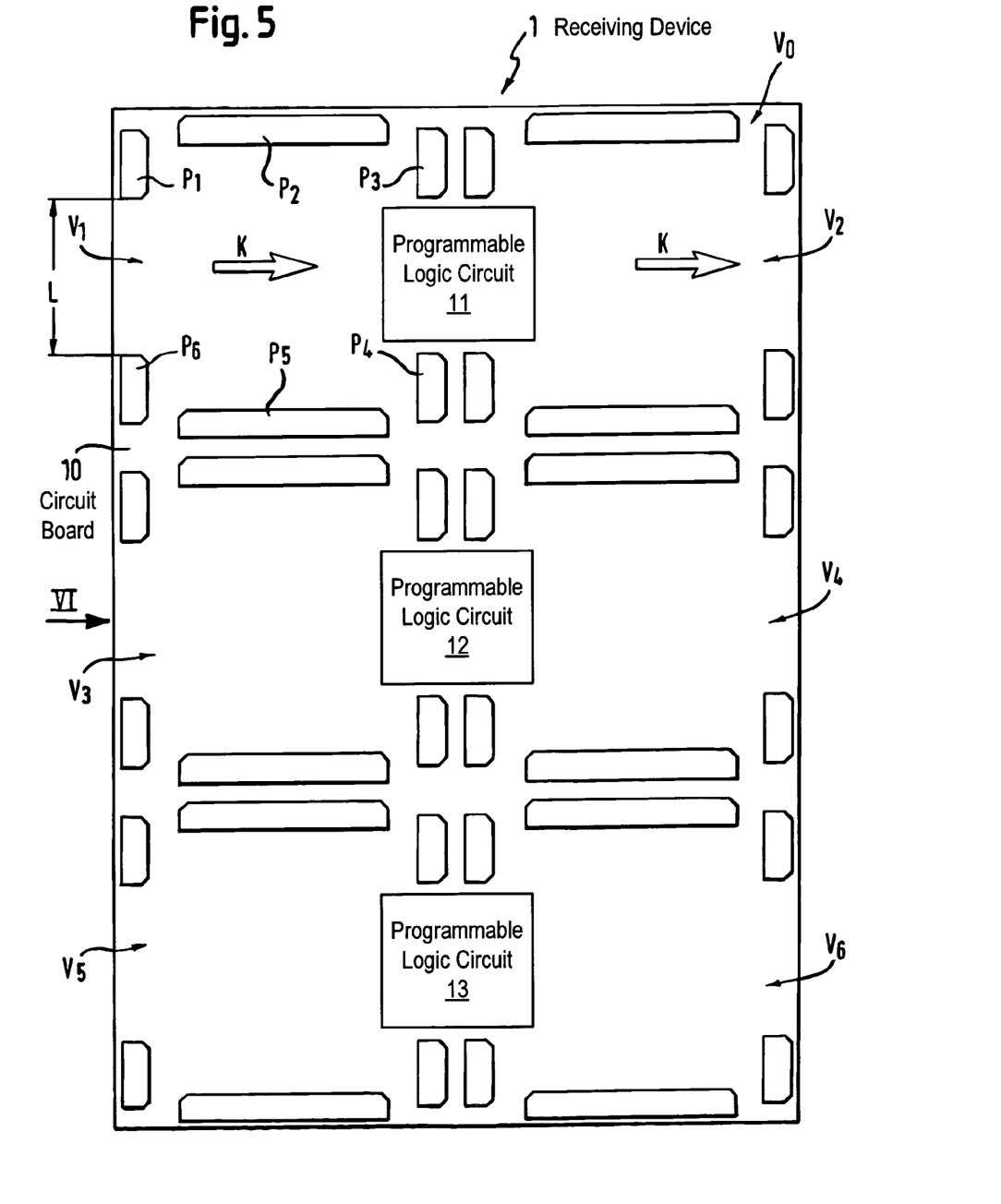
FIG. 5 shows a schematic outline of the plug connector arrangement, as it is provided on a receiving device, a main connection device, and a group connection device.

The schematic outline of a circuit board 10 of the receiving device 1 shown in FIG. 1 is shown in FIG. 5. The individual channels of the particular bus lines, implemented as conducting tracks, are not shown, so that the figure does not appear obscured. In this top view of the circuit board 10, the programmable logic circuits 11, 12, 13 and the upper plug connector arrangements $V_O$ are only shown schematically. The upper plug connector arrangement $V_O$ includes multiple plug connectors, which are positioned in six groups $V_1, V_2, V_3, V_4, V_5, V_6$ of six plug connectors $P_1, P_2, P_3, P_4, P_5, P_6$ each, positioned essentially in a square. Each of the plug connector groups $V_1, V_2, V_3, V_4, V_5, V_6$ is assigned one of the bus lines 111, 112, 121, 122, 131, 132, and each of the bus channels is connected to one of the contacts of the plug connectors $P_1, P_2, P_3, P_4, P_5, P_6$. The plug connector groups $V_1, V_2, V_3, V_4, V_5$, and $V_6$ are also implemented in the same way as described above with reference to the plug connector group $V_1$ for the bus line 111.

It may also be seen in FIG. 5 that spacing L is kept free between the plug connectors $P_1$ and $P_6$ positioned in the lengthwise direction of the circuit board 10, through which the cool air may flow to the programmable logic circuit 11 positioned between the plug connectors $P_3$ and $P_4$ and may flow past it laterally and above it and may exit again on the opposite side through a corresponding opening L' of length L. The course of the cool air flow is schematically shown by arrows K.

Figure 6:
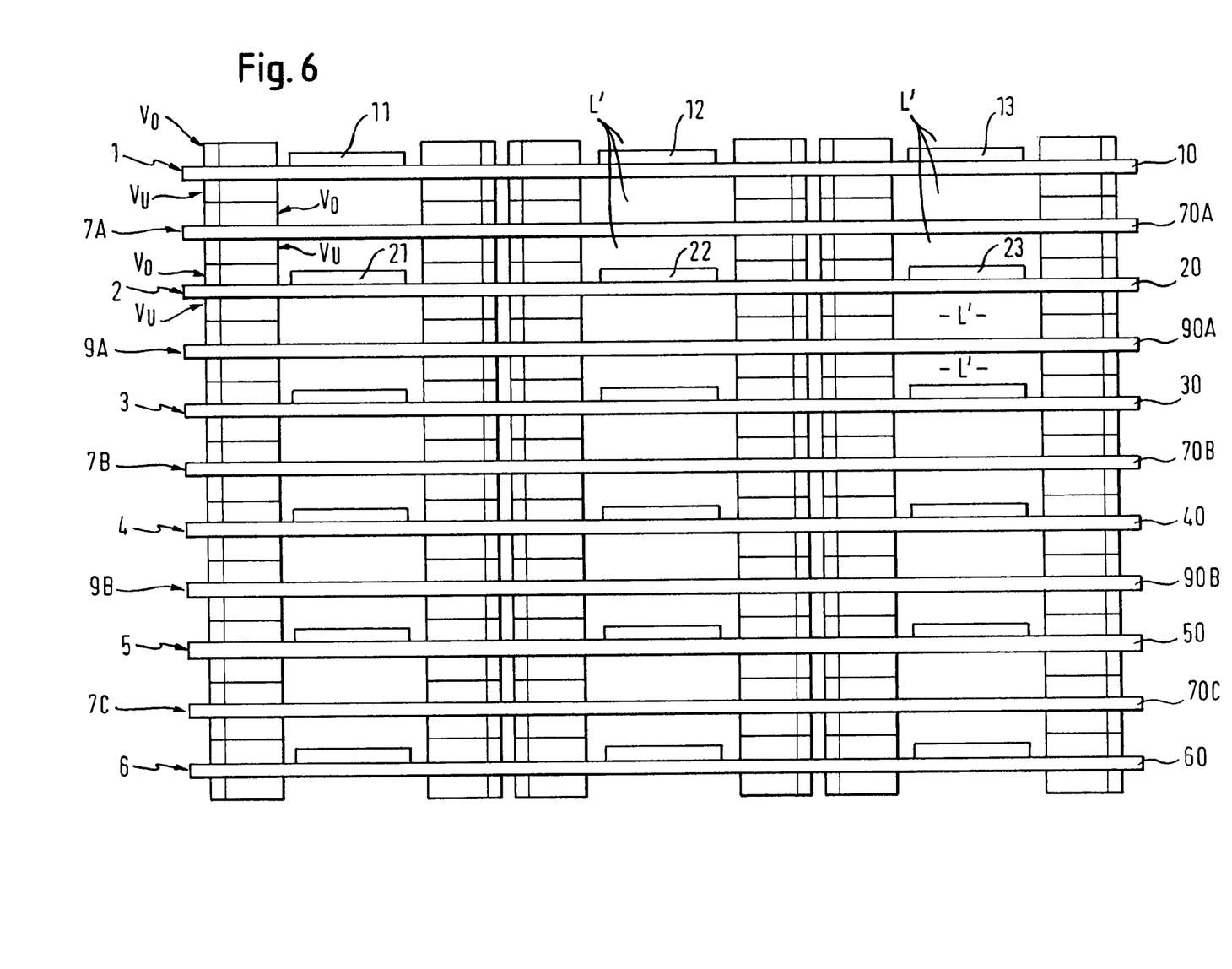
FIG. 6 shows a side view of a circuit board sandwich of a device according to the present invention.

FIG. 6 shows a side view of a stack of circuit boards of receiving devices 1, 2, 3, 4, 5, 6, as well as main connection devices 7A, 7B, 7C and group connection devices 9A, 9B in the direction of the arrow VI in FIG. 5. It may be seen in this illustration that the lower plug connector arrangements $V_U$ are positioned congruent in outline with the upper plug connector arrangements $V_O$, so that the circuit boards 10, 70A, 20, 90A, 30, 70B, 40, 90B, 50, 70C, 60 may be plugged into one another as shown in FIG. 6. The cool air entrance opening and/or cool air outlet opening L' formed by the spacing L and the vertical spacing between two circuit boards may also be seen in FIG. 6. Furthermore, it may be seen that both the uppermost circuit board 10 and the lowermost circuit board 60 are provided with free upper and lower plug connector arrangements $V_O$ and $V_U$, respectively, into which even further devices, such as expansion devices, may be plugged.

Figure 7:
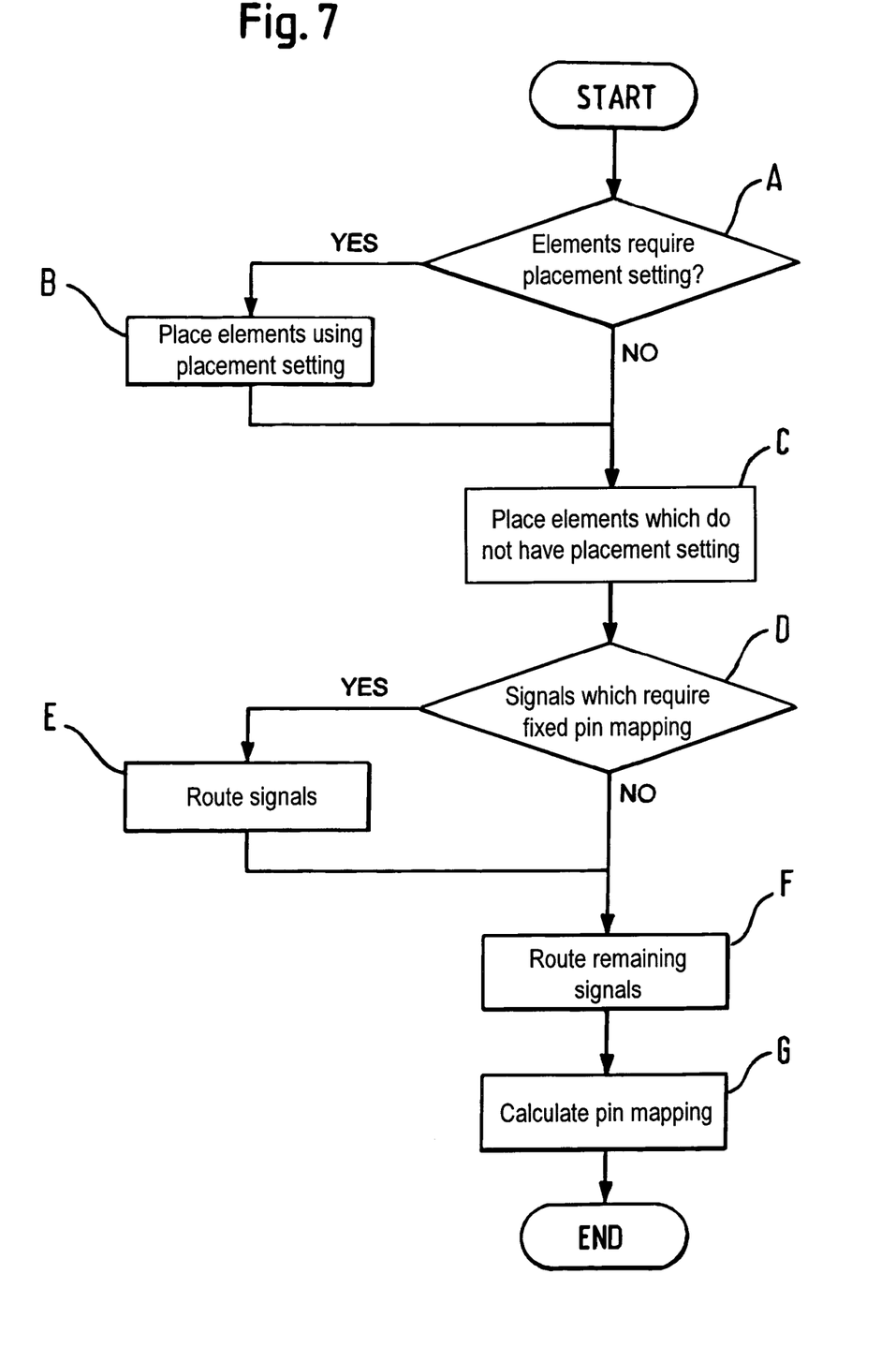
FIG. 7 shows a flowchart of a computer program for flexible interconnection of the connection structure of a device according to the present invention.

The sequence of a computer program for flexible interconnection of the connection structure of a device according to the present invention is schematically shown in FIG. 7.

After the start of the program, the computer program checks in a first step A whether there are elements in the design of an integrated circuit to be emulated which require a placement setting. Elements of this type are, for example, programmable logic circuits or expansion circuit boards. If there are elements of this type, these elements are placed, using their placement setting, before all other elements in step B. Subsequently, those elements which do not have a placement setting are placed in step C. After the elements have all been placed, it is checked in step D whether there are signals which require fixed pin mapping, i.e., fixed assignment of terminal contacts. Signals of this type having fixed pin mapping may, for example, be the connections from the programmable logic circuits to the expansion elements. If there are signals of this type, they are routed with priority in step E. All remaining signals are then routed in step F. In this case, routing is understood as the assignment of conduction paths in the overall bus connection structure. If all signals have been routed, in step G the pin mapping is calculated on the programmable logic circuits; i.e., it is calculated which contacts of which bus line, which is applied to a slot, are to be connected to which terminal of the internal structure of the programmable logic circuit.

When this has been performed, the individual switches of the particular bus switching devices are switched and the internal assignment of the terminal contacts of the particular programmable logic circuits is set up in accordance with the pin mapping calculated.

The present invention is not restricted to the exemplary embodiment above, which is merely used for general explanation of the core idea of the present invention. Rather, in the framework of the protective scope, the device according to the present invention may also assume embodiments other than those described above. In particular, the device may have features in this case which represent a combination of the particular individual features described above.

Reference numbers in the description and the drawings are merely used for better understanding of the present invention and are not intended to restrict the protective scope.

The invention claimed is:

1. A device for emulation of designs for integrated circuits, comprising:
   a receiving device configured for receiving multiple programmable logic circuits having terminal contacts; and
   an electrical connection structure, which has bus lines, each of which includes multiple channels, wherein
   each programmable logic circuit of the multiple programmable logic circuits when connected with the receiving device is connected to at least one bus line of the bus lines and
   wherein the electrical connection structure is configured so that the multiple programmable logic circuits are independently interconnectable with one another,
   wherein at least a part of the terminal contacts of any programmable logic circuit is independently assignable, and
   wherein at least a part of the bus lines connected to the programmable logic circuits are alternately electrically connectable to one another using a switch wherein at least one channel of a bus line is electrically connectable to a channel of at least one other bus line using the switch.

2. The device according to claim 1,
   wherein the multiple channels of a bus line are alternately electrically connectable to multiple channels of another bus line, each channel of the one bus line being electrically connectable to the channel of the other bus line, individual channels of the multiple channels being connectable independently of one another.

3. The device according to claim 1,
   comprising connection bus lines between at least a part of the programmable logic circuits for direct connection of at least a part of the programmable logic circuits.

4. The device according to claim 1, being one of multiple receiving devices and wherein the multiple receiving devices are connectable to one another via connection devices, the connection devices having switchable bus lines.

5. The device according to claim 4,
   further comprising main connection devices, each of which connects two receiving devices to one another, the main connection devices having main connection device bus lines, which connect the bus lines of the two receiving devices assigned to one another to one another and the main connection device bus lines being alternately electrically connectable to one another in such a way that at least one channel of a main connection device bus line is electrically connectable to the channel of at least one other main connection device bus line.

6. The device according to claim 5,
   further comprising group connection devices, each of which connects two receiving device pairs, including two receiving devices, connected to one another using the main connection device, to one another and a group connection device having group connection device bus lines, which are connected to the bus lines of the receiving device pair, and the group connection device bus lines each being switchable in such a way that each channel of each group connection device bus line is assigned one of a plurality of switches and wherein each switch of the plurality of the switches is configured to be switched on and off independently of the other switches of the plurality of switches.

7. The device according to claim 6,
   wherein the receiving devices, the main connection devices, and the group connection devices have circuit boards, which are provided on their upper side and on their lower side with plug connector arrangements which include multiple plug connectors situated in the same position on the circuit boards and the outward-leading bus lines of the circuit boards are electrically connected to both upper and corresponding lower plug connectors of the plug connector arrangement in the same way.

8. The device according to claim 7,
   wherein the circuit boards are positioned one over another and are mechanically and electrically connected to one another using the plug connector arrangements,
   and wherein two circuit boards at a time of the receiving devices are connected into a receiving device pair using a circuit board of a main connection device positioned between the two circuit boards of the receiving devices, to form a receiving-device-main-connection-device circuit board stack,
   and wherein the receiving device pair is one of several receiving device pairs, and wherein the receiving device pairs are connected to one another using the circuit boards of the group connection devices.

9. The device according to claim 8,
   wherein a spacing is provided between some of the plug connectors of the plug connector arrangements, the spacing being dimensioned to allow cool air to flow through the circuit board stack between the plug connectors.

10. The device of claim 1, wherein the multiple programmable logic circuits comprise FPGAs.

* * * * *